United States Patent
Zhang et al.

(10) Patent No.: US 10,629,658 B1
(45) Date of Patent: Apr. 21, 2020

(54) ORGANIC LIGHT-EMITTING DISPLAY PANEL AND DISPLAY DEVICE

(71) Applicant: WuHan TianMa Micro-electronics Co., LTD, Wuhan (CN)

(72) Inventors: Guofeng Zhang, Wuhan (CN); Zhaokeng Cao, Wuhan (CN); Linshan Guo, Wuhan (CN); Tianqing Hu, Wuhan (CN)

(73) Assignee: WuHan TianMa Micro-electronics CO., LTD, Wuhan (CN)

(*) Notice: Subject to any disclaimer, the term of this patent is extended or adjusted under 35 U.S.C. 154(b) by 0 days.

(21) Appl. No.: 16/455,598

(22) Filed: Jun. 27, 2019

(30) Foreign Application Priority Data

Mar. 29, 2019 (CN) .......................... 2019 1 0248326

(51) Int. Cl.
*H01L 27/32* (2006.01)
*H01L 51/52* (2006.01)

(52) U.S. Cl.
CPC ........ *H01L 27/323* (2013.01); *H01L 27/3246* (2013.01); *H01L 27/3276* (2013.01); *H01L 51/5237* (2013.01)

(58) Field of Classification Search
CPC .. H01L 27/323; H01L 27/3246; H01L 51/525
See application file for complete search history.

(56) References Cited

U.S. PATENT DOCUMENTS

| 2015/0380685 | A1* | 12/2015 | Lee ..................... H01L 51/5243 257/40 |
| 2017/0155080 | A1* | 6/2017 | Jo .......................... H01L 27/323 |
| 2018/0053810 | A1 | 2/2018 | Jin et al. |
| 2018/0059862 | A1* | 3/2018 | Zeng ..................... G06F 3/0416 |
| 2018/0196564 | A1* | 7/2018 | Lin ........................ H01L 25/167 |
| 2018/0233541 | A1* | 8/2018 | Zeng ..................... G06F 3/0412 |

FOREIGN PATENT DOCUMENTS

CN 107180852 A 9/2017

* cited by examiner

*Primary Examiner* — Fernando L Toledo
*Assistant Examiner* — Valerie N Newton
(74) *Attorney, Agent, or Firm* — Christensen O'Connor Johnson Kindness PLLC

(57) ABSTRACT

An organic light-emitting display panel and a display device are provided. The organic light-emitting display panel includes: a driving device film layer, an anode layer, a pixel definition layer, an organic light-emitting layer, a cathode layer, an encapsulation film layer, and a touch film layer that are sequentially stacked. The encapsulation film layer includes an organic encapsulation layer. The organic light-emitting display panel has a specially-shaped border area and a straight-line border area. In the cathode connection area, in a direction perpendicular to the organic light-emitting display panel, a top end of the cathode layer is higher in the specially-shaped border area than in the straight-line border area, and the top end of the cathode layer is an end of the cathode layer furthest away from the driving device film layer.

13 Claims, 9 Drawing Sheets

ORGANIC LIGHT-EMITTING DISPLAY PANEL AND DISPLAY DEVICE

CROSS-REFERENCE TO RELATED APPLICATIONS

The present disclosure claims priority to Chinese Patent Application No. 201910248326.9, filed on Mar. 29, 2019, the content of which is incorporated herein by reference in its entirety.

TECHNICAL FIELD

The present disclosure relates to the technical field of display technologies, and in particular, to an organic light-emitting display panel and a display device.

BACKGROUND

With the development of the display technology, an organic light-emitting display (OLED) panel has become more widely used due to its excellent performances such as self-luminosity, high brightness, wide visual angle, and fast response.

In the organic light-emitting display panel, in order to make more use of space or provide a more aesthetic effect, an organic light-emitting display panel having a specially-shaped edge (such as a rounded edge or an edge having a hollow structure) is used. However, a touch electrode located at a specially-shaped edge is prone to wire breakage, thereby resulting in a poor touch effect.

SUMMARY

The present disclosure provides an organic light-emitting display panel and a display device, aiming to alleviate the poor touch effect caused by wire breakage of the touch electrode at the specially-shaped edge.

In an aspect, an embodiment of the present disclosure provides an organic light-emitting display panel. The organic light-emitting display panel includes: a driving device film layer, an anode layer, a pixel definition layer, an organic light-emitting layer, a cathode layer, an encapsulation film layer, and a touch film layer that are sequentially stacked. The encapsulation film layer includes an organic encapsulation layer. The organic light-emitting display panel has a display area and a border area surrounding the display area, the border area includes a specially-shaped border area and a straight-line border area, and each of the specially-shaped border area and the straight-line border area includes a cathode connection area. The anode layer includes a cathode signal connection wire located in the cathode connection area. The pixel definition layer includes a cathode signal connection portion located in the cathode connection area. The cathode signal connection portion includes a hollow connection area in the cathode connection area. The cathode layer is electrically connected to the cathode signal connection wire through the hollow connection area in the pixel definition layer. In the cathode connection area, in a direction perpendicular to the organic light-emitting display panel, a top end of the cathode layer is higher in the specially-shaped border area than in the straight-line border area, and the top end of the cathode layer is an end of the cathode layer furthest away from the driving device film layer.

In another aspect, an embodiment of the present disclosure provides a display device, including the organic light-emitting display panel described above.

BRIEF DESCRIPTION OF DRAWINGS

In order to more clearly illustrate technical solutions in embodiments of the present disclosure or in the related art, the accompanying drawings used in the embodiments and in the related art are briefly introduced as follows. It should be noted that the drawings described as follows are merely part of the embodiments of the present disclosure, other drawings can also be acquired by those skilled in the art.

DESCRIPTION OF EMBODIMENTS

In order to make the purpose, technical solutions, and advantages of the embodiments of the present disclosure better understood, the technical solutions in the embodiments of the present disclosure are described in the following with reference to the accompanying drawings. It should be understood that the described embodiments are merely exemplary embodiments of the present disclosure, which shall not be interpreted as providing limitations to the present disclosure. All other embodiments obtained by those skilled in the art according to the embodiments of the present disclosure are within the scope of the present disclosure.

The terms used in the embodiments of the present disclosure are merely for the purpose of describing particular embodiments but not intended to limit the present disclosure. Unless otherwise noted in the context, the singular form expressions "a," "an," "the," and "said" used in the embodiments and appended claims of the present disclosure are also intended to represent plural form expressions thereof.

In order to further illustrate beneficial effects of the embodiments of the present disclosure, problems existing in the related art are explained prior to describing the embodiments of the present disclosure.

Figure 1:
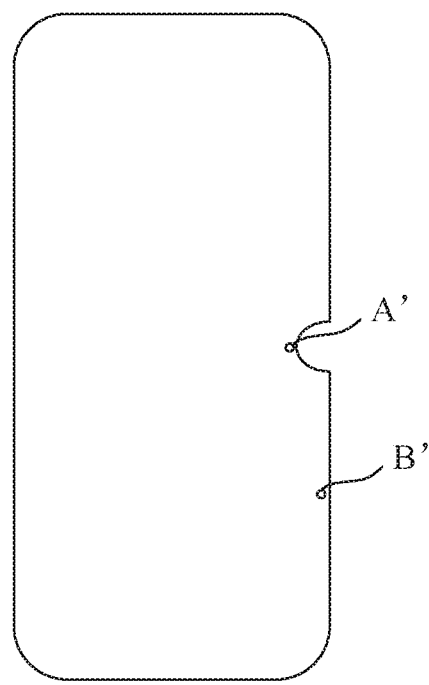
FIG. 1 is a schematic structural diagram of an organic light-emitting display panel in the related art.
Figure 2:
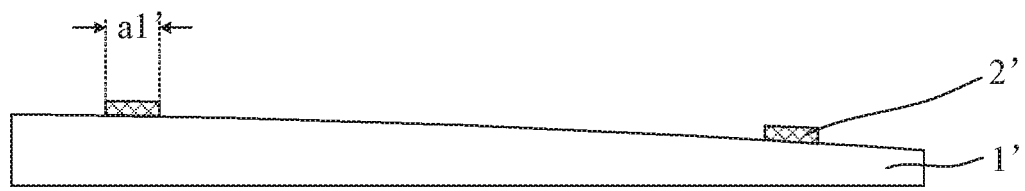
FIG. 2 is a structural cross-sectional view of an area A' of FIG. 1.
Figure 3:
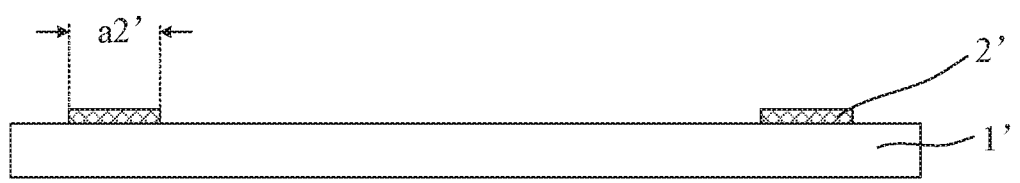
FIG. 3 is a structural cross-sectional view of an area B' of FIG. 1.

FIG. 1 is a schematic structural diagram of an organic light-emitting display panel in the related art, FIG. 2 is a structural cross-sectional view of an area A' of FIG. 1, and FIG. 3 is a structural cross-sectional view of an area B' of FIG. 1. As shown in FIGS. 1-3, in the related art, an organic light-emitting display panel includes a specially-shaped edge. In an example, a hole is arranged at an edge of the display panel, and the edge of the display panel located at the hole is a specially-shaped edge. Here, an area A' is a specially-shaped edge area, and an area B' is a straight-line edge area. The organic light-emitting display panel includes an encapsulation film layer 1' and a touch film layer 2' that are sequentially stacked. The touch film layer 2' includes signal metal wires for implementing a touch function. An organic material layer is provided in the encapsulation film layer 1'. The organic material layer is formed by inkjet printing. However, during a process of forming the organic material layer, due to the fluidity of the organic material layer and the inkjet printing process, the organic material layer is significantly thinner in the specially-shaped edge area of the organic material layer (i.e., the area A') in a direction close to the edge. That is, in the specially-shaped edge area, a thickness of the encapsulation film layer 1' in a direction perpendicular to the organic light-emitting display panel decreases in a direction close to the edge of the organic light-emitting display panel. The touch film layer 2' is formed on the encapsulation film layer 1'. A signal metal wire is formed in the touch film layer 2' in the following manner. First a metal layer is formed, and a photoresist is formed on the metal layer; then the photoresist is photoetched into a pattern; then an etching liquid is sprayed on the photoresist having this pattern, and the etching liquid etches away the metal exposed outside the photoresist to make the metal layer form this pattern; finally the photoresist is removed to form a final signal metal wire. In the specially-shaped edge area, since the thickness of the encapsulation film layer 1' is small, more etching liquid is accumulated in the specially-shaped edge area during etching of the signal metal wire, and thus more metal is etched away. In the non-specially-shaped edge area, such as the area B', i.e., the straight-line edge area, the thickness of the encapsulation film layer 1' changes slightly, and thus the signal metal wire in the touch film layer 2' has a larger width. That is, the width a1' of the signal metal wire in the specially-shaped edge area is smaller than the width a2' of the signal metal wire in the non-specially-shaped edge area. Therefore, in the specially-shaped edge area, the width a1' of the signal metal wire in the touch film layer 2' is smaller, and thus the wire may be easily broken, resulting in a poor touch performance.

Figure 4:
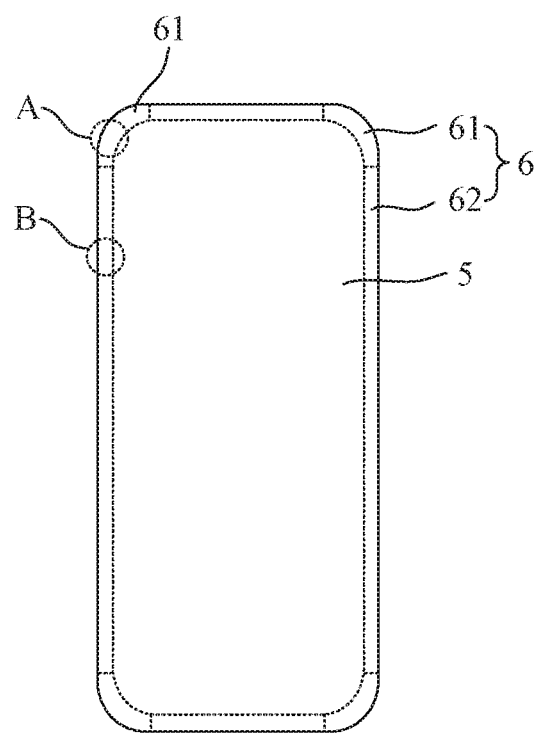
FIG. 4 is a schematic structural diagram of an organic light-emitting display panel according to an embodiment of the present disclosure.
Figure 5:
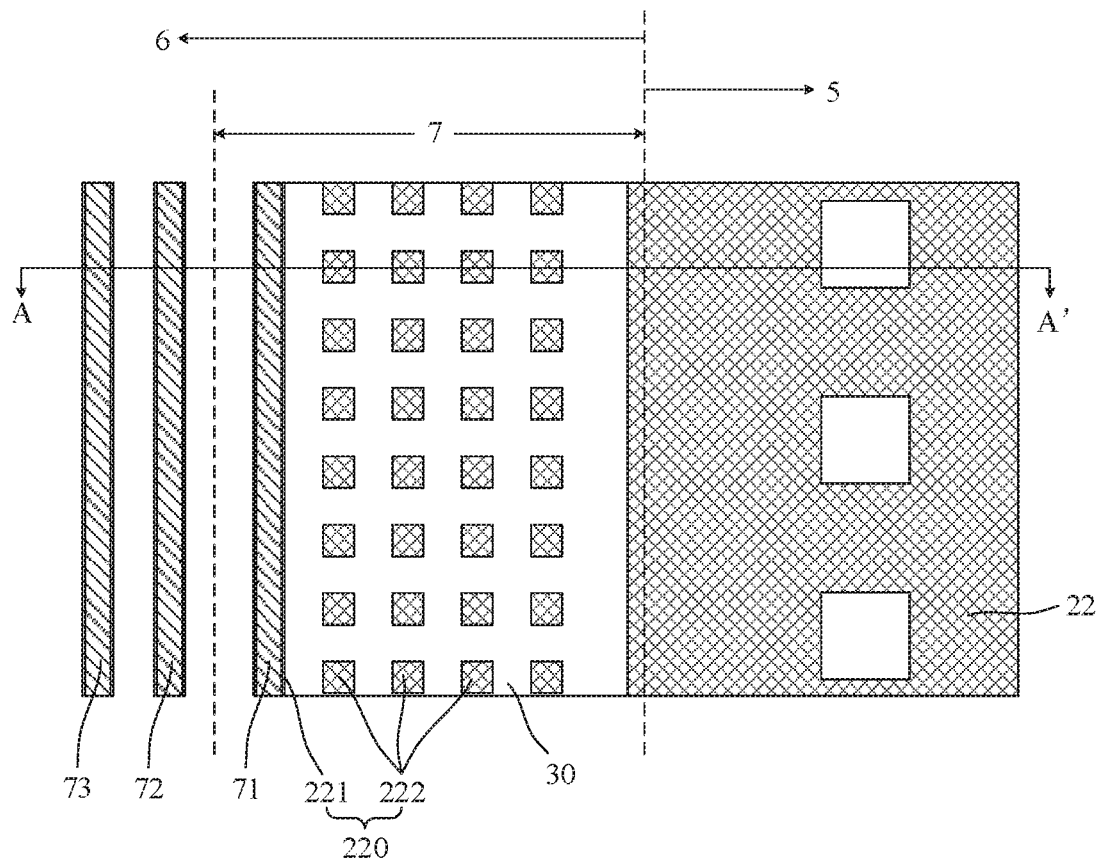
FIG. 5 is an enlarged structural diagram of an area A of FIG. 4.
Figure 6:
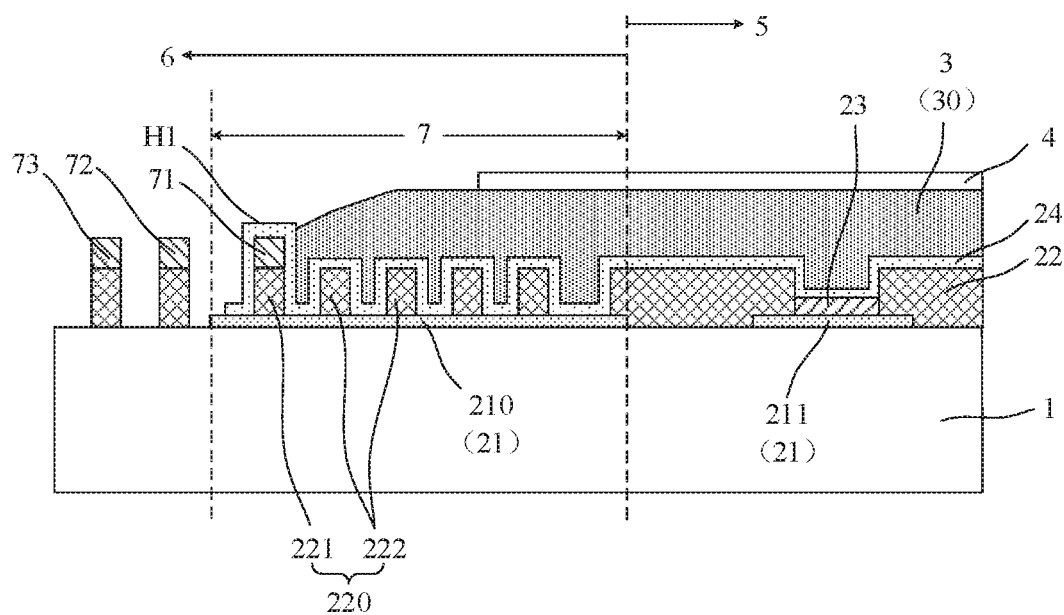
FIG. 6 is a structural cross-sectional view along a direction AA' of FIG. 5.
Figure 7:
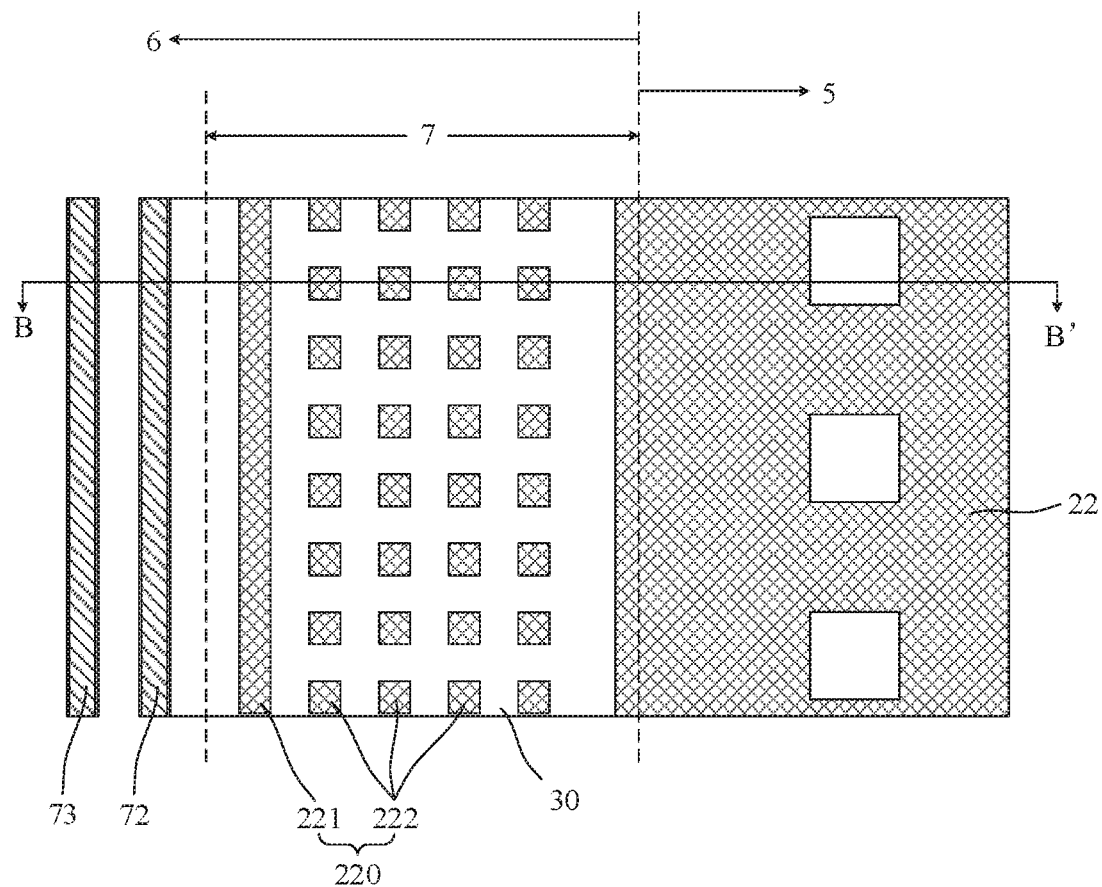
FIG. 7 is an enlarged structural diagram of an area B of FIG. 4.
Figure 8:
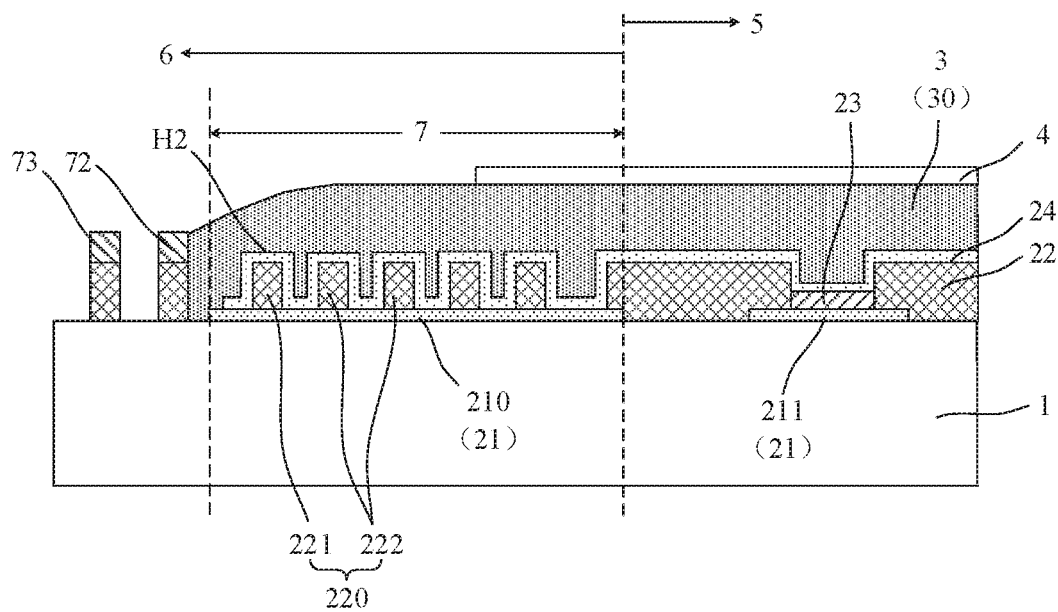
FIG. 8 is a structural cross-sectional view along a direction BB' of FIG. 7.

FIG. 4 is a schematic structural diagram of an organic light-emitting display panel according to an embodiment of the present disclosure, FIG. 5 is an enlarged structural diagram of an area A of FIG. 4, FIG. 6 is a structural cross-sectional view along a direction AA' of FIG. 5, FIG. 7 is an enlarged structural diagram of an area B of FIG. 4, and FIG. 8 is a structural cross-sectional view along a direction BB' of FIG. 7. As shown in FIGS. 4-8, an embodiment of the present disclosure provides an organic light-emitting display panel. The organic light-emitting display panel includes a driving device film layer 1, an anode layer 21, a pixel definition layer 22, an organic light-emitting layer 23, a cathode layer 24, an encapsulation film layer 3, and a touch film layer 4 that are sequentially stacked. The encapsulation film layer 3 includes an organic encapsulation layer 30. The organic light-emitting display panel has a display area 5 and a border area 6 surrounding the display area 5. The border area 6 includes a specially-shaped border area 61 and a straight-line border area 62. The specially-shaped border area 61 and the straight-line border area 62 each include a cathode connection area 7. The anode layer 21 includes a cathode signal connection wire 210 located in the cathode connection area 7. The pixel definition layer 22 includes a cathode signal connection portion 220 located in the cathode connection area. The cathode signal connection portion 220 has a hollow connection area. In the cathode connection area 7, the cathode layer 24 is electrically connected to the cathode signal connection wire 210 through the hollow connection area in the pixel definition layer 22. In the cathode connection area 7, in a direction perpendicular to the organic light-emitting display panel, a top end H1 of the cathode layer 24 is higher in the specially-shaped border area 61 than in the straight-line border area 62. Here, the top end of the cathode layer 24 is an end of the cathode layer 24 furthest away from the driving device film layer 1.

In the display area 5, the pixel definition layer 22 has an aperture corresponding to each sub-pixel, the anode layer 21 includes an anode 211 corresponding to each sub-pixel. The aperture of the pixel definition layer 22 exposes the anode 211, and the organic light-emitting layer 23 is disposed in the aperture of the pixel definition layer 22. The cathode layer 24 covers the aperture corresponding to each sub-pixel. That is, at the aperture corresponding to each sub-pixel, the anode 211, the organic light-emitting layer 23 and the cathode layer 24 that are stacked form a light-emitting device. For this light-emitting device, a voltage is respectively applied on the cathode layer 24 and the anode 211, so that electrons and holes are injected into the organic light-emitting layer 23 and recombined in the organic light-emitting layer 23, thereby releasing energy to emit light and thus achieving light-emission of the sub-pixel. The driving device film layer 1 includes a pixel driving circuit corresponding to each sub-pixel, and the pixel driving circuit is configured to drive the light-emitting device to emit light. The driving device film layer 1 may further include a peripheral circuit such as a scan driving circuit. The touch film layer 4 is configured to implement the touch function of the organic light-emitting display panel. The touch film layer 4 includes signal metal wires for transmitting signals. The embodiments of the present disclosure are not limited to any structure of the touch film layer 4. For example, the touch film layer 4 may have a single layer structure or a multi-layer structure, in which a touch electrode and a touch signal wire for transmitting a signal are provided. Here, the touch electrode may have a metal mesh structure, and the metal mesh may be formed by signal metal wires. The encapsulation film layer 3 is configured to encapsulate the light-emitting device in the display area so as to prevent external water and oxygen from eroding the light-emitting device. The encapsulation film layer 3 includes an organic encapsulation layer 30. The organic encapsulation layer 30 is formed by inkjet printing. However, during a process of forming the organic material layer 30, due to the fluidity of the organic material layer 30 and the inkjet printing process, the thickness of the organic material layer 30 gradually decreases in the specially-shaped border area. The touch film layer 4 is formed on the encapsulation portion 3. In the specially-shaped border area 61, a signal metal wire is formed in the touch film layer 4 in the following manner. First a metal layer is formed, and a photoresist is formed on the metal layer; then the photoresist is photoetched into a pattern; then an etching liquid is sprayed on the photoresist having this pattern, and the etching liquid etches away the metal exposed outside the photoresist to make the metal layer form this pattern; finally the photoresist is removed to form a final signal metal wire. Since a top end H1 of the cathode layer 24 in the specially-shaped border area 61 is higher than a top end H2 of the cathode layer 24 in the straight-line border area 62, the organic encapsulation layer 30 has a larger thickness in the specially-shaped border area 61 due to a larger height of the top end of the cathode layer 24 during etching of the metal wire. That is, the thickness of the organic encapsulation layer 30 in the specially-shaped border area 61 gets close to the thickness of the organic encapsulation layer 30 in the straight-line border area 62, so that the etching liquid which would otherwise be accumulated around the signal metal wire in the specially-shaped border area 61 is reduced. Thus, the portion of the signal metal wire that is etched is also reduced. That is, compared with the related art, a width of the signal metal wire in the touch film layer 4 is increased, and a probability that the signal metal wire in the specially-shaped border area 61 is excessively etched to cause wire breakage is reduced. Therefore, a problem of poor touch effect caused by wire breakage of the touch electrode in the specially-shaped edge area is mitigated.

Optionally, in an embodiment, as shown in FIGS. 4-8, in the specially-shaped border area 61, a first blocking wall 71 is arranged between the pixel definition layer 22 and the cathode layer 24. The first blocking wall 71 extends in an extending direction of the specially-shaped border area 61. In both the specially-shaped border area 61 and the straight-line border area 62, a second blocking wall 72 is arranged at a side of the pixel definition layer 22 that is away from the driving device film layer 1. The second blocking wall 72 extends in an extending direction of the specially-shaped border area 61 and the straight-line border area 62. In the specially-shaped border area 61, the second blocking wall 72 is located at a side of the first blocking wall 71 that is away from the display area 5. In the specially-shaped border area 61, the organic encapsulation layer 30 extends from the display area 5 to the first blocking wall 71 and is blocked by the first blocking wall 71 from flowing to the side of the first blocking wall 71 that is away from the display area 5. That is, when the manufacture of the encapsulation film layer 3 is completed, in the specially-shaped border area 61, the organic encapsulation layer 30 is arranged only at a side of the first blocking wall 71 that is close to the display area 5; and in the straight-line border area 62, the organic encapsulation layer 30 extends from the display area 5 to the second blocking wall 72. Since the first blocking wall 71 is not arranged in the straight-line border area 62, the cathode layer 24 has a smaller height in the cathode connection area 7 and does not block the organic encapsulation layer 30, whereas the organic encapsulation layer 30 is blocked by the second blocking wall 72.

In particular, in the specially-shaped border area 61, since the first blocking wall 71 is arranged between the cathode layer 24 and the pixel definition layer 22 in the cathode connection area 7, the top end H1 of the cathode layer 24 in the specially-shaped border area 61 has a larger height. Due to the first blocking wall 71, the organic encapsulation layer 30 is blocked and limited within an area close to the display area 5. In the straight-line border area 62, since the first blocking wall is not arranged between the cathode layer 24 and the pixel definition layer 22 in the cathode connection area 7, the top end H2 of the cathode layer 24 in the straight-line border area 62 has a smaller height, and thus will not limit the organic encapsulation layer 30 here. Due to the second blocking wall 72, the organic encapsulation layer 30 is blocked and limited within an area away from the display area 5. Therefore, in the specially-shaped border area 61, compared with the related art, more of the organic encapsulation layer 30 is aggregated in a smaller area. That is, the organic encapsulation layer 30 has a larger height in the specially-shaped border area 61. That is, the thickness of the organic encapsulation layer 30 in the specially-shaped border area 61 gets close to the thickness of the organic encapsulation layer 30 in the straight-line border area 62, so that the etching liquid which would otherwise be accumulated around the signal metal wire in the specially-shaped border area 61 is reduced during the process of manufacturing the signal metal wire in the touch film layer 4. Thus, the portion of the signal metal wire that is etched is reduced. That is, compared with the related art, the width of the signal metal wire in the touch film layer 4 is increased, and a probability that the signal metal wire in the specially-shaped border area 61 is excessively etched to cause wire breakage is reduced. Therefore, a problem of poor touch effect caused by wire breakage of the touch electrode in the specially-shaped edge area is mitigated. It should be noted that in the border area 6, a third blocking wall 73 may be further arranged at a side of the second blocking wall 72 that is away from the display area 5. In this way, on one hand, the organic encapsulation layer 30 can be further blocked, and on the other hand, the encapsulation film layer 3 may also include an inorganic film layer (not shown), and the third blocking wall 73 can prevent crack propagation of the inorganic film layer when cutting the panel.

In an embodiment, as shown in FIGS. 4-8, the cathode signal connection portion 220 includes a strip-shaped extension portion 221 and an island pattern portion 222, and the island pattern portion 222 is located between the strip-shaped extension portion 221 and the display area 5. The strip-shaped extending portion 221 extends in the extending direction of the border area 6. The first blocking wall 71 is located between the strip-shaped extending portion 221 and the cathode layer 24.

In an embodiment, a plurality of island pattern portions 222 are distributed in the border area 6, so that the cathode layer 24 is better connected to the cathode signal connection wire 210 in the cathode connection area 7, and overlapping of the strip-shaped extension portion 221 with the first blocking wall 71 makes their combination better block the organic encapsulation layer 30.

In an embodiment, in the display area 5, a support portion (not shown) is disposed between the pixel definition layer 22 and the cathode layer 24. The first blocking wall 71, the second blocking wall 72 and the support portion are also disposed in the same layer. The support portion is configured to support a mask in the process of manufacturing the cathode layer 24. The first blocking wall 71, the second blocking wall 72 and the support portion are disposed in the same layer, that is, they can be formed by one and the same patterning process, thereby reducing the number of process steps.

Figure 9:
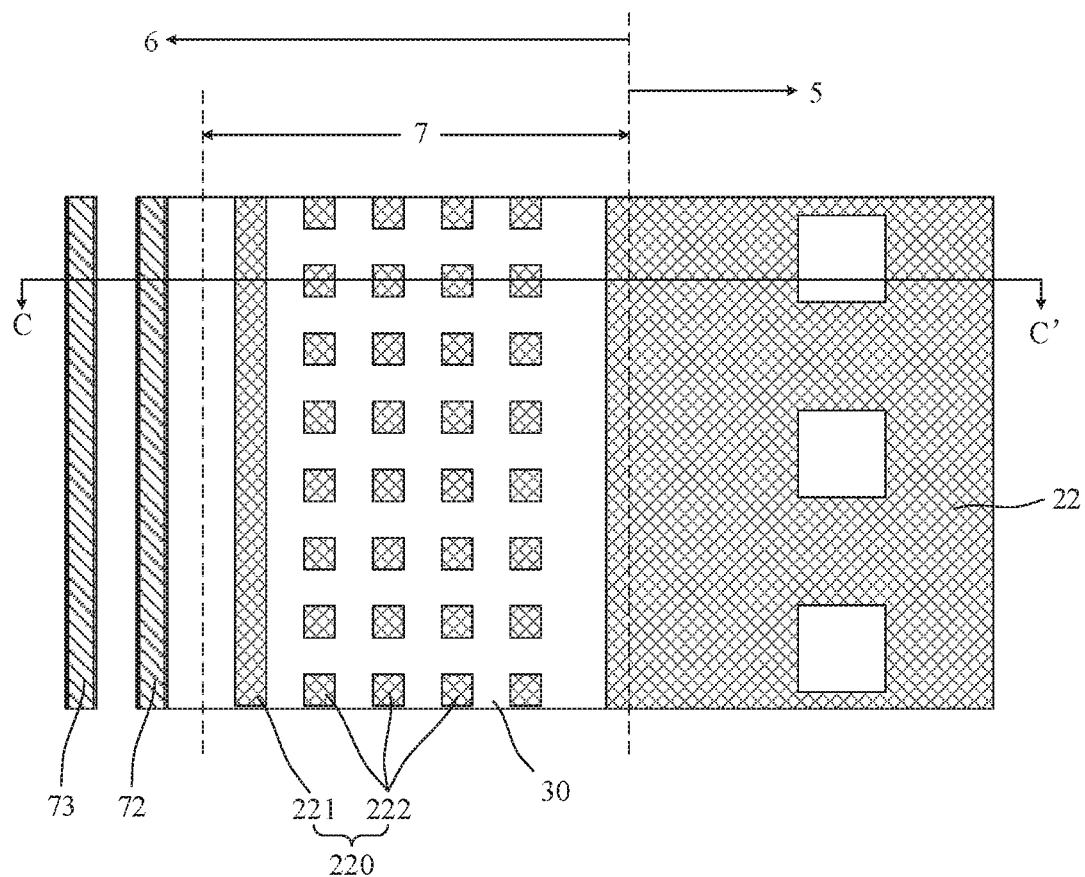
FIG. 9 is another enlarged structural diagram of an area A of FIG. 4.
Figure 10:
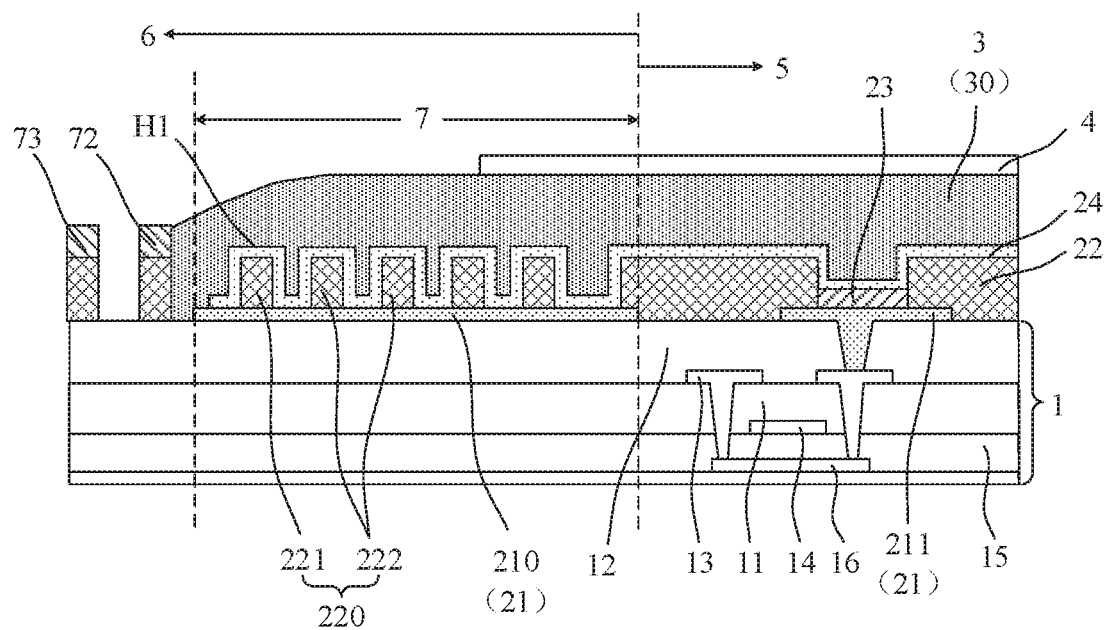
FIG. 10 is a structural cross-sectional view along a direction CC' of FIG. 9.
Figure 11:
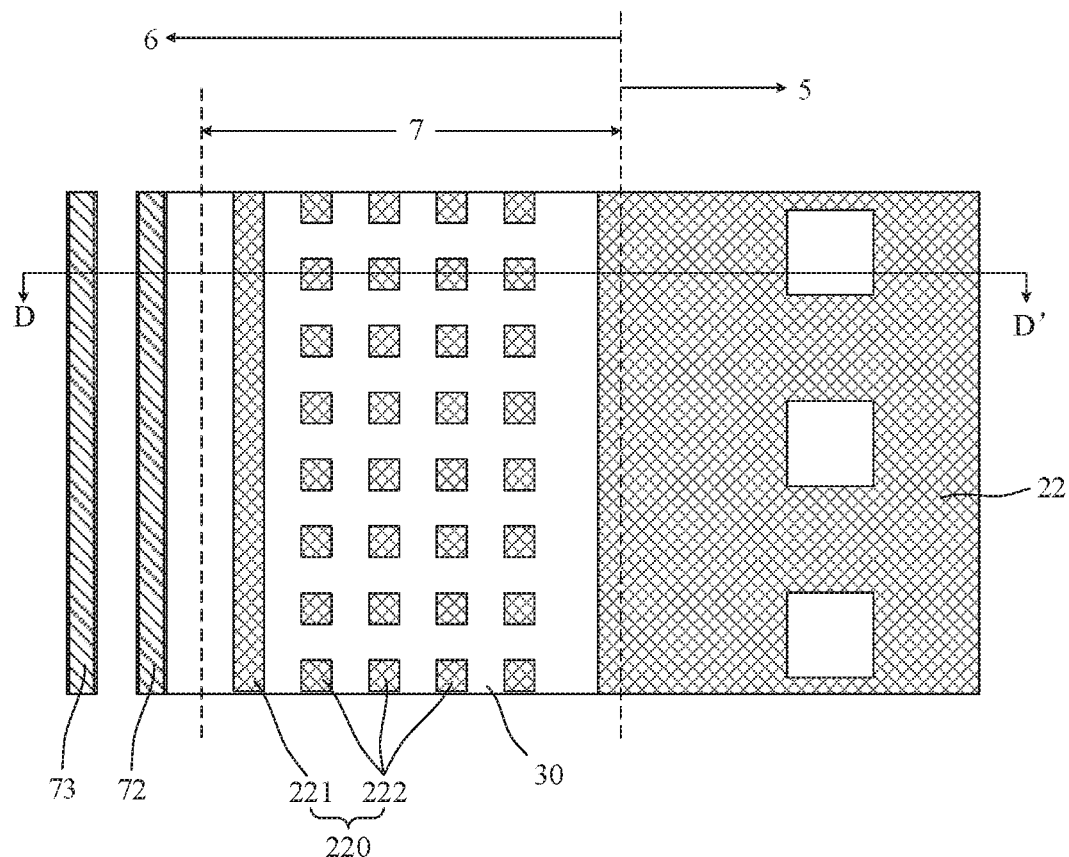
FIG. 11 is another enlarged structural diagram of an area B of FIG. 4.
Figure 12:
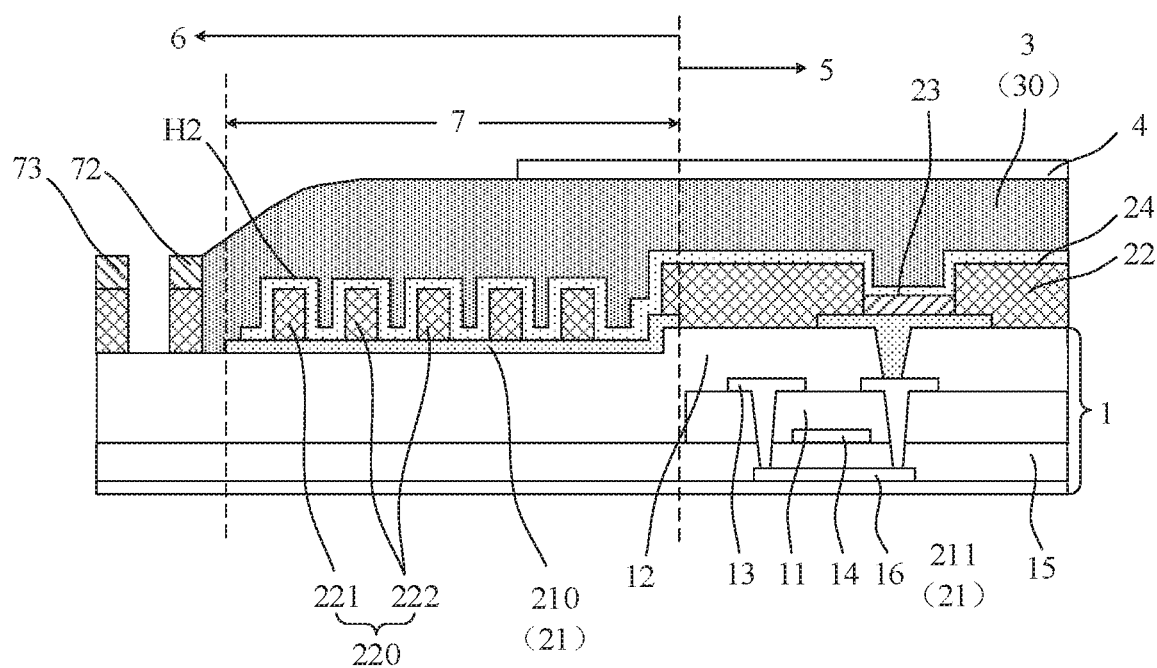
FIG. 12 is a structural cross-sectional view along a direction DD' of FIG. 11.

FIG. 9 is another enlarged structural diagram of an area A of FIG. 4, FIG. 10 is a structural cross-sectional view along a direction CC' of FIG. 9, FIG. 11 is another enlarged structural diagram of an area B of FIG. 4, and FIG. 12 is a structural cross-sectional view along a direction DD' of FIG. 11. In an embodiment, as shown in FIG. 4 and FIGS. 9-12, in the cathode connection area 7, a thickness of the driving device film layer 1 is larger in the specially-shaped border area 61 than in the straight-line border area 62 in the direction perpendicular to the organic light-emitting display panel.

Since the thickness of the driving device film layer 1 is larger in the specially-shaped border area 61 than in the straight-line border area 62, an overall height of the cathode layer 24 in the cathode connection area 7 is larger in the specially-shaped border area 61 than in the straight-line border area 62. Therefore, the organic encapsulation layer 30 has a larger overall height in the specially-shaped border area 61. That is, the thickness of the organic encapsulation layer 30 in the specially-shaped border area 61 gets close to the thickness of the organic encapsulation layer 30 in the straight-line border area 62, so that the etching liquid which would otherwise be accumulated around the signal metal wire in the specially-shaped border area 61 is reduced during the process of manufacturing the signal metal wire in the touch film layer 4. Thus, the portion of the signal metal wire that is etched is reduced. That is, compared with the related art, the width of the signal metal wire in the touch film layer 4 is increased, and a probability that the signal metal wire in the specially-shaped border area 61 is excessively etched to cause wire breakage is reduced. Therefore, a problem of poor touch effect caused by wire breakage of the touch electrode in the specially-shaped edge area is mitigated.

In an embodiment, as shown in FIG. 4 and FIGS. 9-12, the driving device film layer 1 includes an organic insulation layer 11. The organic insulation layer 11 overlaps the pixel definition layer 22 in the specially-shaped border area 61, and the organic insulation layer 11 does not overlap the straight-line border area 62.

The driving device film layer 1 includes the organic insulation layer 11 having a large thickness. The organic insulation layer 11 is arranged in the specially-shaped border area 61 and not arranged in the straight-line border area 62, so that the thickness of the driving device film layer 1 is larger in the specially-shaped border area 61 than in the straight-line border area 62.

In an embodiment, as shown in FIGS. 4 and 9-12, in a direction facing away from the anode layer 21, the driving device film layer 1 includes a planarization layer 12, a source and drain metal layer 13, an organic insulation layer 11, a gate metal layer 14, a gate insulation layer 15, and a semiconductor layer 16. The source and drain metal layer 13 is used to form source and drain electrodes of a thin film transistor, and the gate metal layer 14 is used to form a gate electrode of the thin film transistor. The semiconductor layer 16 is used to form an active layer of the thin film transistor. The thin film transistor is used to form a circuit in the driving device film layer 1 so as to control the light-emitting device. The organic insulation layer 11 is used to achieve insulation between the source and drain metal layer 13 and the gate metal layer 14 of the thin film transistor in the display area.

It should be noted that, in the structure shown in FIG. 9 and FIG. 10, it is only in the cathode connection area 7 where the thickness of the driving device film layer 1 is larger in the specially-shaped border area 61 than in the straight-line border area 62, such that the top end H1 of the cathode layer 24 in the specially-shaped border area 61 is higher than the top end H2 of the cathode layer 24 in the straight-line border area 62. The structure shown in FIG. 9 and FIG. 10 can be combined with the structure shown in FIG. 5 and FIG. 6. That is, in the specially-shaped border area 61, the first blocking wall 71 is arranged between the pixel definition layer 22 and the cathode layer 24; and in the cathode connection area 7, the thickness of the driving device film layer 1 is larger in the specially-shaped border area 61 than in the straight-line border area 62. In this way, on one hand, the overall height of the organic encapsulation layer 30 in the specially-shaped border area 61 is increased by increasing the overall height of the cathode layer 24 in the specially-shaped border area 61. On the other hand, the organic encapsulation layer 30 is blocked and limited within an area close to the display area 5 by the blocking wall 71, thereby increasing the overall height of the organic encapsulation layer 30 in the specially-shaped border area 61. In these two ways, the overall height of the organic encapsulation layer 30 in the specially-shaped border area 61 can be increased. Therefore, the etching liquid which would otherwise be accumulated around the signal metal wire in the specially-shaped border area 61 is reduced during the process of manufacturing the signal metal wire in the touch film layer 4. Thus, the portion of the signal metal wire that is etched is also reduced. That is, compared with the related art, the width of the signal metal wire in the touch film layer 4 is increased, and a probability that the signal metal wire in the specially-shaped border area 61 is excessively etched to cause wire breakage is reduced. Therefore, a problem of poor touch effect caused by wire breakage of the touch electrode in the specially-shaped edge area is mitigated.

Figure 13:
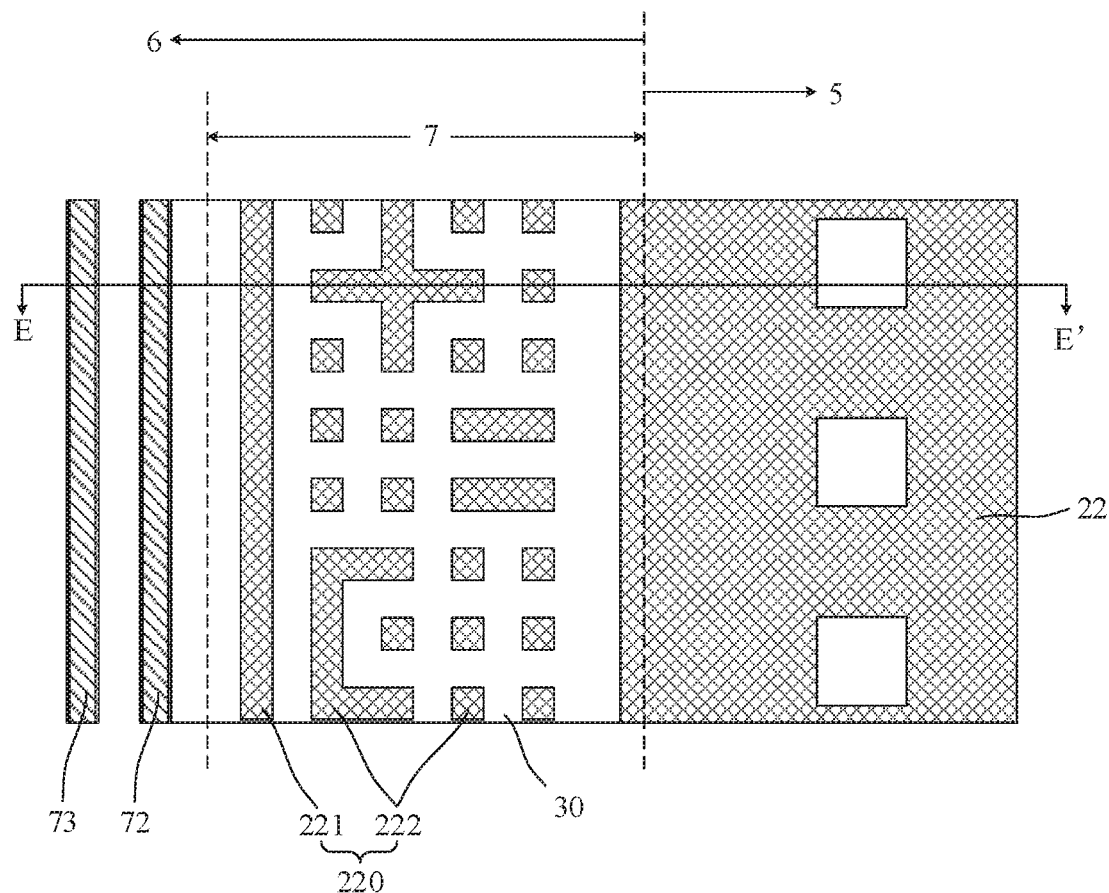
FIG. 13 is still another enlarged structural diagram of an area A of FIG. 4.
Figure 14:
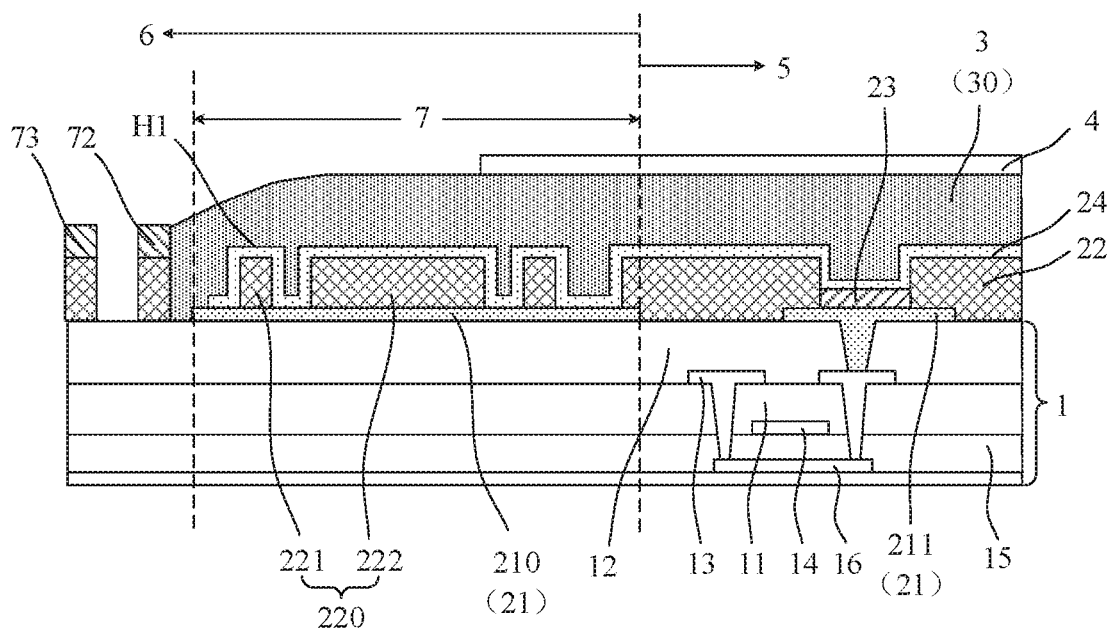
FIG. 14 is a structural cross-sectional view along a direction EE' of FIG. 13.

FIG. 13 is still another enlarged structural diagram of an area A of FIG. 4, and FIG. 14 is a structural cross-sectional view along a direction EE' of FIG. 13. In an embodiment, as shown in FIGS. 4, 7, 8, and 11-14, an area occupied by the cathode signal wire connection portion 220 per unit area is larger in the specially-shaped border area 61 than in the straight-line border area 62.

As shown in the figures, the cathode signal wire connection portion 220 occupies a large area in the specially-shaped border area 61. Therefore, the area of the organic encapsulation layer 30 in the specially-shaped border area 61 is reduced, thereby increasing the overall height of the organic encapsulation layer 30 in the specially-shaped border area 61. Therefore, the etching liquid which would otherwise be accumulated around the signal metal wire in the specially-shaped border area 61 is reduced during the process of manufacturing the signal metal wire in the touch film layer 4. Thus, the portion of the signal metal wire that is etched is reduced. That is, compared with the related art, the width of the signal metal wire in the touch film layer 4 is increased, and a probability that the signal metal wire in the specially-shaped border area 61 is excessively etched to cause wire breakage is reduced. Therefore, a problem of poor touch effect caused by wire breakage of the touch electrode in the specially-shaped edge area is mitigated. It should be noted that the structure shown in FIG. 13 and FIG. 14 can be combined with other structures in the embodiments of the present disclosure. In an example, the area occupied by the cathode signal wire connection portion 220 per unit area is larger in the specially-shaped border area 61 than in the straight-line border area 62, and the thickness of the driving device film layer 1 is larger in the specially-shaped border area 61 than in the straight-line border area 62. In another example, the area occupied by the cathode signal wire connection portion 220 per unit area is larger in the specially-shaped border area 61 than in the straight-line border area 62, and in the specially-shaped border area 61, the first blocking wall 71 is arranged between the pixel definition layer 22 and the cathode layer 24. Alternatively, in still another example, the area occupied by the cathode signal wire connection portion 220 per unit area is larger in the specially-shaped border area 61 than in the straight-line border area 62, and in the specially-shaped border area 61, the thickness of the driving device film layer 1 is larger in the specially-shaped border area 61 than in the straight-line border area 62, and in the specially-shaped border area 61, the first blocking wall 71 is arranged between the pixel definition layer 22 and the cathode layer 24.

In an embodiment, the cathode signal connection portion 220 includes an island pattern portion 222, and the island pattern portion 222 includes a plurality of individual island structures. At least one of the island structures in the specially-shaped border area 61 has an area that is larger than an area of any island structure in the straight-line border area 62. For example, in some embodiments, each of the island structures in the straight-line border area 62 has a same rectangle shape, and at least one of the island structures in the specially-shaped border area 61 has a rectangle shape, whereas the other island structures in the specially-shaped border area 61 each has a cross shape or a linear shape occupying a larger area.

In an embodiment, at least one of the island structures in the specially-shaped border area 61 is reused as an alignment mark.

In an example, the island structure having a cross shape can increase its space occupation, thereby increasing the thickness of the organic encapsulation layer 30 in the specially-shaped border area 61. Moreover, in some embodiments, a polarizer needs to be attached to the organic light-emitting display panel after the manufacture of the touch film layer 4 has completed. Since the organic light-emitting display panel and the polarizer both have a specially-shaped edge, accurate alignment is required between them. When at least one of the island structures in the specially-shaped border area 61 is reused as the alignment mark, the polarizer can be aligned by using the alignment mark, thereby improving alignment accuracy between the polarizer and the organic light-emitting display panel.

In an embodiment, as shown in FIG. 4, the organic light-emitting display panel has a shape of a rounded rectangle. The rounded rectangle has a straight-line edge and an arc edge. Here, the border area 6 close to the arc edge is the specially-shaped border area 61, and the border area 6 close to the straight-line edge is the straight-line border area 62.

Figure 15:
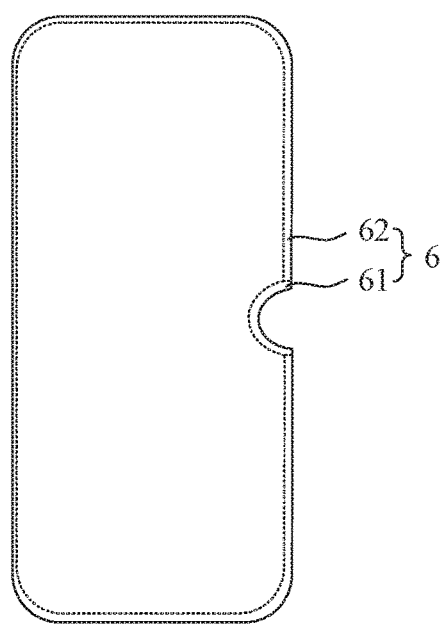
FIG. 15 is a schematic structural diagram of an organic light-emitting display panel according to another embodiment of the present disclosure.

FIG. 15 is a schematic structural diagram of an organic light-emitting display panel according to another embodiment of the present disclosure. In an embodiment, as shown in FIG. 15, the organic light-emitting display panel has a straight-line edge and a hole recessed from the straight-line edge towards the center of the organic light-emitting display panel. Here, the border area 6 close to the hole is the specially-shaped border area 61, and the border area 6 close to the straight-line edge is the straight-line border area 62. When the organic light-emitting display panel is applied to a display device, a device such as a front camera will be arranged at the hole.

Figure 16:
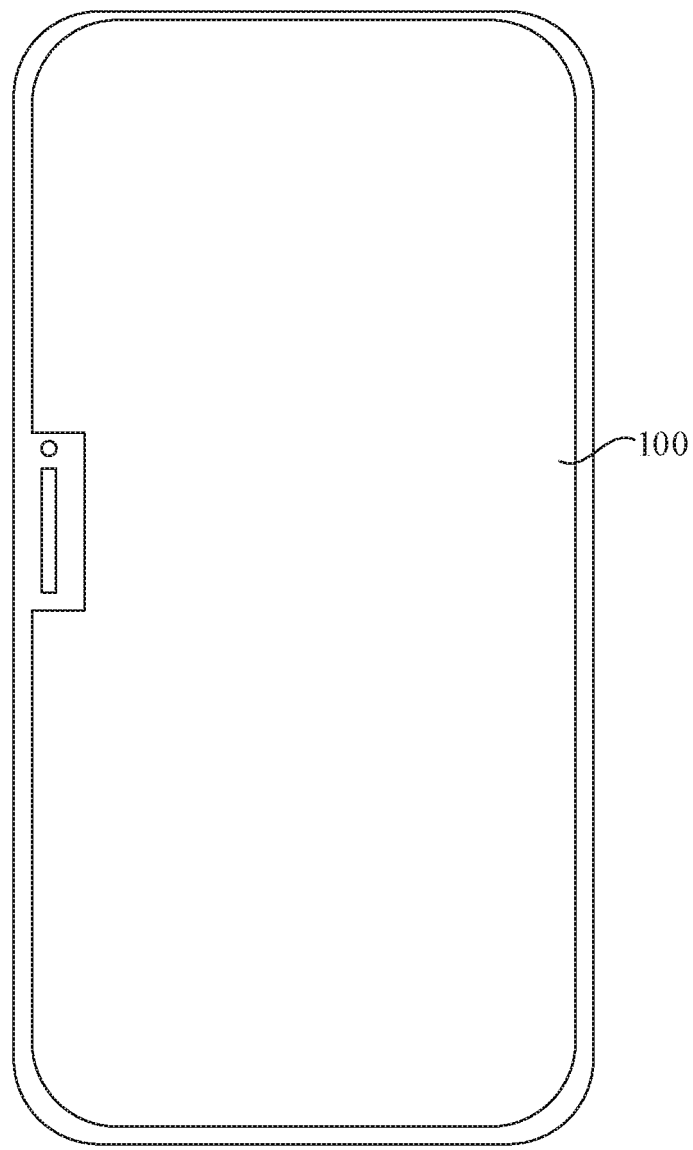
FIG. 16 is a schematic structural diagram of a display device according to an embodiment of the present disclosure.

FIG. 16 is a schematic structural diagram of a display device according to an embodiment of the present disclosure. As shown in FIG. 16, an embodiment of the present disclosure further provides a display device, including the organic light-emitting display panel 100 described above.

The display device in the embodiments of the present disclosure may be any electronic device having a display function, such as a touch display screen, a cellphone, a tablet computer, a notebook computer, an electronic paper book, or a television.

The above-described embodiments are merely preferred embodiments of the present disclosure and are not intended to limit the present disclosure. Any modifications, equivalent substitutions and improvements made within the principle of the present disclosure shall fall into the protection scope of the present disclosure.

Finally, it should be noted that, the above-described embodiments are merely for illustrating the present disclosure but not intended to provide any limitation. Although the present disclosure has been described in detail with reference to the above-described embodiments, it should be understood by those skilled in the art that, it is still possible to modify the technical solutions described in the above embodiments or to equivalently replace some or all of the technical features therein, but these modifications or replacements do not cause the essence of corresponding technical solutions to depart from the scope of the present disclosure.

What is claimed is:

1. An organic light-emitting display panel, comprising: a driving device film layer, an anode layer, a pixel definition layer, an organic light-emitting layer, a cathode layer, an encapsulation film layer, and a touch film layer that are sequentially stacked;

wherein the encapsulation film layer comprises an organic encapsulation layer;

wherein the organic light-emitting display panel has a display area and a border area surrounding the display area, the border area comprises a specially-shaped border area and a straight-line border area, and each of the specially-shaped border area and the straight-line border area comprises a cathode connection area;

wherein the anode layer comprises a cathode signal connection wire located in the cathode connection area, the pixel definition layer comprises a cathode signal connection portion located in the cathode connection area, the cathode signal connection portion comprises a hollow connection area, and in the cathode connection area, the cathode layer is electrically connected to the cathode signal connection wire through the hollow connection area in the pixel definition layer; and wherein in the cathode connection area, in a direction perpendicular to the organic light-emitting display panel, a top end of the cathode layer is higher in the specially-shaped border area than in the straight-line border area, and the top end of the cathode layer is an end of the cathode layer furthest away from the driving device film layer.

2. The organic light-emitting display panel according to claim 1, wherein in the specially-shaped border area, a first blocking wall is arranged between the pixel definition layer and the cathode layer, and the first blocking wall extends in an extending direction of the specially-shaped border area;

wherein in the specially-shaped border area and the straight-line border area, a second blocking wall is arranged at a side of the pixel definition layer that is away from the driving device film layer, and the second blocking wall extends in an extending direction of the specially-shaped border area and the straight-line border area; and in the specially-shaped border area, the second blocking wall is located at a side of the first blocking wall that is away from the display area;

wherein in the specially-shaped border area, the organic encapsulation film layer extends from the display area to the first blocking wall; and wherein in the straight-line border area, the organic encapsulation film layer extends from the display area to the second blocking wall.

3. The organic light-emitting display panel according to claim 2,
wherein the cathode signal connection portion comprises a strip-shaped extension portion and an island pattern portion, the island pattern portion is located between the strip-shaped extension portion and the display area, and the strip-shaped extension portion extends in an extending direction of the border area; and
wherein the first blocking wall is located between the strip-shaped extension portion and the cathode layer.

4. The organic light-emitting display panel according to claim 2, wherein, in the display area, a support portion is arranged between the pixel definition layer and the cathode layer; and wherein the support portion, the first blocking wall and the second blocking wall are arranged in the same layer.

5. The organic light-emitting display panel according to claim 1, wherein in the cathode connection area, a thickness of the driving device film layer in a direction perpendicular to the organic light-emitting display panel is larger in the specially-shaped border area than in the straight-line border area.

6. The organic light-emitting display panel according to claim 5, wherein the driving device film layer comprises an organic insulation layer, and in the cathode connection area, the organic insulation layer:
overlaps the pixel definition layer in the specially-shaped border area, and
does not overlap the straight-line border area.

7. The organic light-emitting display panel according to claim 6, wherein in a direction away from the anode layer, the driving device film layer comprises sequentially a planarization layer, a source and drain metal layer, the organic insulation layer, a gate metal layer, a gate insulation layer, and a semiconductor layer.

8. The organic light-emitting display panel according to claim 1, wherein an area occupied by the cathode signal connection portion per unit area is larger in the specially-shaped border area than in the straight-line border area.

9. The organic light-emitting display panel according to claim 8,
wherein the cathode signal connection portion comprises an island pattern portion, and the island pattern portion comprises a plurality of individual island structures; and
wherein at least one of the plurality of island structures in the specially-shaped border area has an area that is larger than an area of any island structure of the plurality of island structures in the straight-line border area.

10. The organic light-emitting display panel according to claim 9, wherein the at least one of the plurality of island structures in the specially-shaped border area is reused as an alignment mark.

11. The organic light-emitting display panel according to claim 1, wherein the organic light-emitting display panel has a shape of a rounded rectangle having a straight-line edge and an arc edge, a part of the border area adjacent to the arc edge is the specially-shaped border area, and a part of the border area adjacent to the straight-line edge is the straight-line border area.

12. The organic light-emitting display panel according to claim 1, wherein the organic light-emitting display panel has a straight-line edge and a hole recessed from the straight-line edge towards a center of the organic light-emitting display panel, a part of the border area adjacent to the hole is the specially-shaped border area, and a part of the border area adjacent to the straight-line edge is the straight-line border area.

13. A display device, comprising an organic light-emitting display panel, which comprises:
a driving device film layer, an anode layer, a pixel definition layer, an organic light-emitting layer, a cathode layer, an encapsulation film layer, and a touch film layer that are sequentially stacked;
wherein the encapsulation film layer comprises an organic encapsulation layer;
wherein the organic light-emitting display panel has a display area and a border area surrounding the display area, the border area comprises a specially-shaped border area and a straight-line border area, and each of the specially-shaped border area and the straight-line border area comprises a cathode connection area;
wherein the anode layer comprises a cathode signal connection wire located in the cathode connection area, the pixel definition layer comprises a cathode signal connection portion located in the cathode connection area, the cathode signal connection portion comprises a hollow connection area, and in the cathode connection area, the cathode layer is electrically connected to the cathode signal connection wire through the hollow connection area in the pixel definition layer; and
wherein in the cathode connection area, in a direction perpendicular to the organic light-emitting display panel, a top end of the cathode layer is higher in the specially-shaped border area than in the straight-line border area, and the top end of the cathode layer is an end of the cathode layer furthest away from the driving device film layer.

* * * * *